United States Patent
Tam et al.

(10) Patent No.: US 8,106,700 B2
(45) Date of Patent: Jan. 31, 2012

(54) WIDEBAND VOLTAGE TRANSLATORS

(75) Inventors: Kimo Y. F. Tam, Lincoln, MA (US);
Jennifer Lloyd, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 380 days.

(21) Appl. No.: 12/503,372

(22) Filed: Jul. 15, 2009

(65) Prior Publication Data
US 2010/0277215 A1 Nov. 4, 2010

Related U.S. Application Data

(60) Provisional application No. 61/174,689, filed on May 1, 2009.

(51) Int. Cl.
*H03L 5/00* (2006.01)
(52) U.S. Cl. .......................................... 327/333; 326/80
(58) Field of Classification Search .................. 327/333, 327/108; 326/63, 64, 68, 75, 80, 81; 365/189.11
See application file for complete search history.

(56) References Cited

U.S. PATENT DOCUMENTS

| | | | |
|---|---|---|---|
| 5,559,464 A | 9/1996 | Orii et al. | |
| 5,818,278 A * | 10/1998 | Yamamoto et al. | 327/333 |
| 6,275,112 B1 | 8/2001 | Muza | |
| 6,282,146 B1 | 8/2001 | Guo et al. | |
| 6,608,905 B1 | 8/2003 | Muza et al. | |
| 6,946,876 B2 * | 9/2005 | Isezaki et al. | 326/80 |
| 7,068,091 B1 | 6/2006 | Kwong | |
| 7,710,152 B1 | 5/2010 | El Bacha et al. | |
| 2004/0090259 A1 | 5/2004 | Randazzo et al. | |
| 2004/0150454 A1 | 8/2004 | Bhattacharya et al. | |
| 2006/0125521 A1 | 6/2006 | Kim | |
| 2008/0094111 A1 | 4/2008 | Nakamori et al. | |
| 2008/0204109 A1 | 8/2008 | Pilling et al. | |

* cited by examiner

*Primary Examiner* — Long Nguyen
(74) *Attorney, Agent, or Firm* — Knobbe Martens Olson & Bear LLP

(57) ABSTRACT

In embodiments of the present invention, the problems of poor low-frequency response, slow speed, high cost and high power consumption in conventional voltage translators are addressed by processing high frequency and low frequency components of an input signal separately in two parallel stages without the use of large passive components or slow devices. At the output, the processed high frequency and low frequency components are seamlessly merged at a combining stage that maintains the integrity of the frequency response over the complete translator bandwidth.

20 Claims, 6 Drawing Sheets

WIDEBAND VOLTAGE TRANSLATORS

RELATED APPLICATIONS

The present application claims priority under 35 U.S.C. §119 from U.S. Provisional Patent Application Ser. No. 61/174,689, filed on May 1, 2009, the entire contents of which are hereby incorporated by reference.

FIELD OF THE INVENTION

The present invention relates generally to voltage translators used in integrated circuits (ICs), and more specifically, to wideband voltage translators used in high-speed ICs.

BACKGROUND OF THE INVENTION

In high-speed ICs, it is often necessary to drive signals, i.e. translate signal voltages, from one voltage domain to another (higher or lower) voltage domain. For example, in high-speed ICs, it may be required to translate signal voltages between an "I/O" voltage domain and a "core" voltage domain, or between a "clean" analog voltage domain and a "dirty" digital voltage domain. The signals to be translated may be single-ended signals or differential signals. In the case of single-ended signals, the voltage translation effectively changes the reference voltage of the signals of interest, and in the case of differential signals, the voltage translation alters the common mode voltage of the signals.

Various implementations of a voltage translation circuit exist in the prior art; the following is a discussion of three conventional implementations. The first implementation translates signal voltage from an input voltage domain to an output voltage domain by using large series AC-coupling capacitors tied to large resistors. In effect, the capacitors block the DC components and pass the AC components of the signal, and generate the output signal in the output voltage domain. The resistors and capacitors in this implementation are required to be large to pass the low-frequency content without undesirable "droop" in the frequency response. However, the use of large resistors or large capacitors results in large circuit area and high cost, which are undesirable. In addition, the parasitic capacitance of the AC-coupling capacitor tends to negatively effect the high frequency performance of the circuit.

The second implementation uses emitter followers or source followers to shift voltages between input and output domains, hence eliminating the need for large passive components, like in the first implementation, with minimal compromise of speed. However, this implementation does not readily allow an arbitrary shift in the voltage level of a signal, and particularly, with regard to differential signals, this implementation has an undesirable property that the output common mode voltage is proportional to the input common mode voltage.

The third implementation employs a transconductance amplifier to convert the input voltage signal to a current signal that is delivered across the voltage domain boundary. At the output side of this implementation, either a resistive load or another transconductance stage may be used to convert the current signal back to a voltage signal. This approach also does not require large passive components, but is often much slower than the two above-discussed implementations because it often requires slower high-voltage devices or p-type devices in the signal path.

SUMMARY OF THE INVENTION

In embodiments of the present invention, the problems of poor low-frequency response, slow speed, high cost and high power consumption in voltage translators are addressed by processing high frequency and low frequency components of an input signal separately in two parallel stages without the use of large passive components or slow devices. At the output, the processed high frequency and low frequency components are seamlessly merged at a combining stage that maintains the integrity of the frequency response over the complete translator bandwidth. In various embodiments, voltage translators and methods pertaining to this invention may be used in programmable gain amplifiers (PGAs) in an RF communication system operating over a wide range of frequencies.

Accordingly, in one aspect, the invention pertains to a voltage level translator for translating an input signal in an input voltage domain to an output signal in an output voltage domain. The translator includes a low frequency stage, a high frequency stage, and a combining stage. The low frequency stage receives and processes the input signal to generate a first processed signal in a low frequency range, wherein the first processed signal is in the output voltage domain. The high frequency stage receives and processes the input signal to generate a second processed signal in a high frequency range, wherein the second processed signal determines a bandwidth of the translator. The combining stage combines the first and second processed signals to generate the output signal in the output voltage domain.

In various embodiments, at least one of the input signal and the output signal is a single-ended signal or a differential signal.

In various embodiments, the translator is implemented using CMOS or BiCMOS technology.

In various embodiments, the low frequency stage includes a DC-coupled amplifier. In one embodiment, the DC-coupled amplifier includes a transconductance amplifier for converting the input voltage signal into a current signal. The DC-coupled amplifier may further comprise a conversion stage for receiving and converting the current signal into the first processed signal. In one embodiment, the DC-coupled amplifier further includes a cascode stage operatively connected between the transconductance amplifier and the conversion stage for transferring the current signal therebetween.

In various embodiments, the high frequency stage comprises an AC-coupled amplifier. In one embodiment, the AC-coupled amplifier includes a source follower or an emitter follower amplifier for amplifying the input signal to generate the second processed signal. In another embodiment, the AC-coupled amplifier further includes a gain enhancement block.

In one embodiment, the combining stage includes an RC, an LC or an RLC filter.

In one embodiment, the low frequency and high frequency stages are implemented using the same transistors.

In another aspect, the invention pertains to a method of translating an input signal in an input voltage domain to an output signal in an output voltage domain. The method includes receiving the input signal at a low frequency stage and at a high frequency stage. In one embodiment, at the low frequency stage, the input signal is processed to generate a first processed signal in a low frequency range, wherein the first processed signal is in the output voltage domain. At the high frequency stage, the input signal is processed to generate a second processed signal in a high frequency range, wherein the second processed signal determines a bandwidth of the translator. The method further includes combining the first and second processed signals at a combining stage to generate the output signal.

In various embodiments, the method is used in a voltage level translation circuit which is implemented using CMOS or BiCMOS technology.

In various embodiments, processing the input signal at the low frequency stage includes converting the input voltage signal into a current signal. In one embodiment, the processing at the low frequency stage further includes converting the current signal into the first processed signal.

In various embodiments, processing the input signal at the high frequency stage includes amplifying the high frequency component of the input signal to generate the second processed signal.

The foregoing and other features and advantages of the present invention will be made more apparent from the description, drawings, and claims that follow.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION OF THE INVENTION

In general, the present invention pertains in various embodiments to voltage level translators and methods for translating signals from one voltage domain to another voltage domain. To provide an overall understanding of the invention, certain illustrative embodiments are described, including voltage level translators and methods for translating signals in, e.g. radio frequency (RF) range from about 10 MHz to about 5000 MHz, in an RF communication system.

Figure 1:
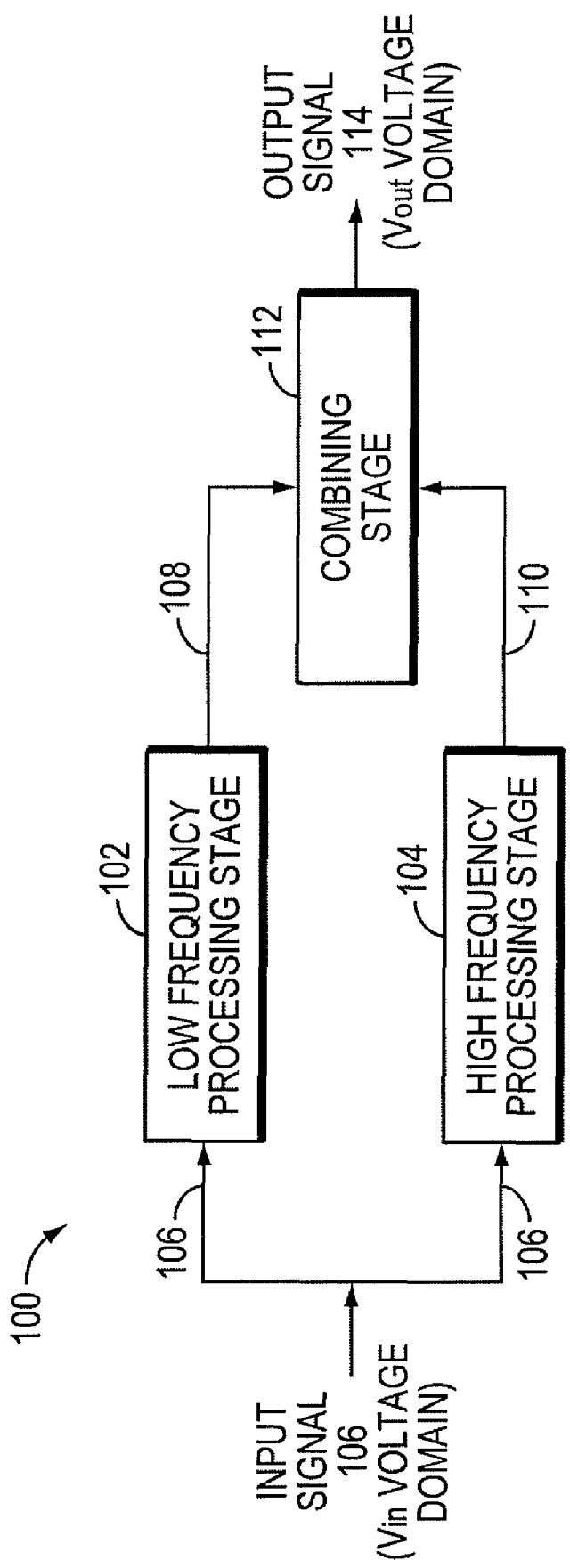
FIG. 1 depicts a block diagram of a voltage translator according to an illustrative embodiment of the invention.

FIG. 1 shows a block diagram of a voltage translator 100 according to an illustrative embodiment of the invention. The illustrated translator translates the signal voltage from an input voltage domain, $V_{in}$, to an output voltage domain, $V_{out}$. The translator 100 includes a low frequency processing stage 102 and a high frequency processing stage 104, both receiving the same input signal 106. The input signal 106 may be a single-ended signal or a differential signal. If the input signal is a single-ended signal, the input voltage domain, $V_{in}$, is represented by the reference value of the input signal 106. When input signal 106 is a differential signal, $V_{in}$ is represented by the common mode voltage of the input signal 106, and in this case, as well known to a person skilled in the art, the input signal 106 will include two 180-degree phase-shifted signals, e.g. 106p, 106n.

The low frequency processing stage 102 may be configured to process the input signal 106 to generate a signal 108 in a low frequency range. In one embodiment, the reference voltage or the common mode voltage of the signal 108 does not determine the overall bandwidth of the translator, but is directly related to the voltage domain of the output signal of the translator 100. Accordingly, the signal 108 may have the reference voltage value (for the single-ended case) or the common mode voltage value (for the differential case) in the desired output voltage domain, $V_{out}$.

The high frequency processing stage 104 may be configured to process the input signal 106 to generate a signal 110 in a high frequency range. In one embodiment, the reference voltage or the common mode voltage of the signal 110 does not contribute toward or is not relevant to the voltage domain of the output signal of the translator 100, but determines the overall bandwidth of the translator 100. Generally, the implementations of the stages 102, 104 may be chosen such that the translator 100 has favorable characteristics in terms of speed, breakdown voltages, power consumption, and size, for both low and high frequency ranges. For example, in one embodiment, the stage 104 is implemented without the use of passive components, or any slow or p-type devices.

In one embodiment, the low frequency processed signal 108 and the high frequency processed signal 110 are combined at a combining stage 112. The combining stage 112 combines the signals 108, 110 to produce an output signal 114, which collectively has the properties of the signals 108, 110. In other words, the output signal 114 has the reference voltage or the common mode voltage in the desired output voltage domain, $V_{out}$, and also has the frequency range which covers the complete bandwidth of the translator 100. In one embodiment, the values chosen for the components in the combining stage 112 determine the frequency (within the translator bandwidth) at which the low frequency processed signal 108 and the high frequency processed signal 110 are merged while still maintaining the integrity of the overall frequency response of the translator 100.

Figure 2:
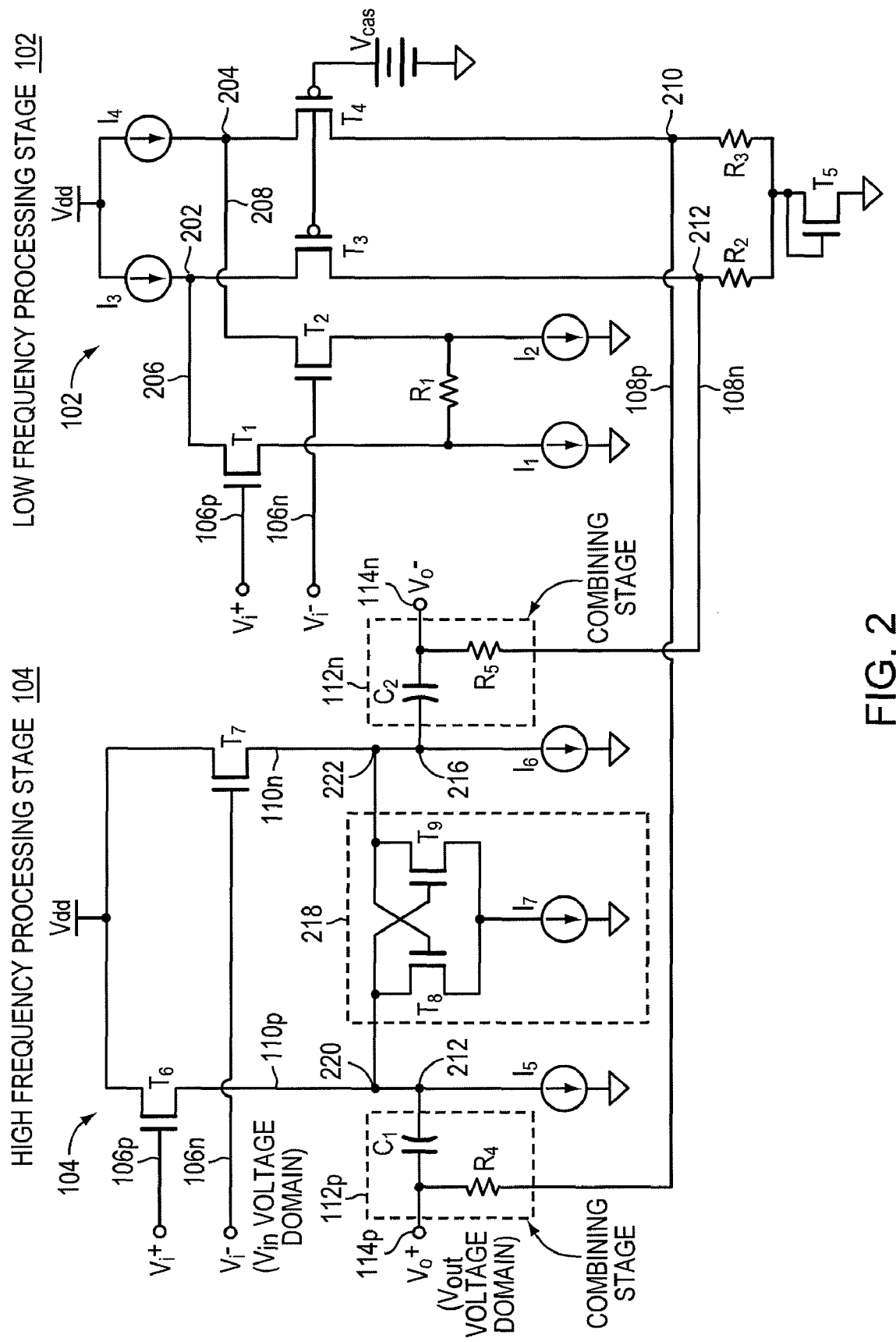
FIG. 2 depicts a CMOS implementation of the voltage translator depicted in FIG. 1.

FIG. 2 shows a CMOS implementation of the embodiment of the translator 100 shown in FIG. 1, and accordingly, uses the same labels for the components shown in both FIGS. 1 and 2. This implementation is shown and will be discussed with respect to differential signals.

In this embodiment, the low frequency processing stage 102 comprises a transconductance amplifier and two "folded" cascode amplifiers. In one embodiment, the transconductance amplifier includes n-type field-effect transistors (FETs) T1 and T2, the gates of both of which receive input signals 106p, 106n. The input signals 106p, 106n have a phase difference of 180 degrees and together constitute the differential input signal 106 (which is in input voltage domain, $V_{in}$) of FIG. 1. The source of the transistor T1 is connected to a current source I1 which is connected to ground. Similarly, the source of the transistor T2 is connected to a current source I2 which is connected to ground. A resistor R1 is connected at the top of the current sources I1, I2. At node 202, the drain of the transistor T1 is connected to one end of a current source I3, the other end of which is connected to a voltage supply, Vdd. Similarly, at node 204, the drain of the transistor T2 is connected to one end of a current source I4, the other end of which is also connected to the voltage supply Vdd. In this embodiment, the transconductance amplifier converts the input voltage signals 106p, 106n into respective current signals 206, 208 supplied at nodes 202, 204.

In one embodiment, one folded cascode amplifier of the low frequency processing stage 102 includes the transistor T1 and a p-type FET T3, and processes the current signal obtained from the difference of a current signal from I3 and the current signal 206. The other folded cascode amplifier includes the transistor T2 and a p-type FET T4, and processes the current signal obtained from the difference of a current signal from 14 and the current signal 208. The drain of the transistor T3 is connected at node 202, and the drain of the transistor T4 is connected at node 204. The gates of the transistors T3, T4 are connected to a biasing voltage source, Vcas, and their sources are connected to load resistors R2 and R3, respectively. The other ends of the resistors R2, R3 are commonly connected to the source of an n-type transistor T5, the gate of which is self-biased and the drain is connected to ground. In one embodiment, Vcas is not greater than Vdd. In one embodiment, the transistors T1, T2, T3, T4 operate in the input voltage domain, $V_{in}$, and the transistor T5 operates in the output voltage domain, $V_{out}$. In one embodiment, the load resistors R2, R3, and the transistor T5 constitute a conversion stage to convert current signals from nodes 202, 204 into voltage signals 108p, 108n. The conversion stage may include other passive and active components connected in different topologies.

The current signal from node 202 passes through the transistor T3, and is converted back to a voltage signal 108n at the resistor R2. Similarly, the current signal from node 204 passes through the transistor T4, and is converted back to a voltage signal 108p at the resistor R3. In one embodiment, the common mode voltage of the signals 108p, 108n is in the desired output voltage domain, $V_{out}$, and is calculated as a sum of the voltage difference between the gate and source, $V_{gs}$ of T5 and the current value (at R2 or R3) times the resistance value (of R2 or R3). The voltage signals 108p, 108n may have the phase difference of 180 degrees and may be available at nodes 210, 212, respectively to be supplied to combining stages 112p, 112n.

Still referring to FIG. 2, in one embodiment, the high frequency processing stage 104 is implemented as an emitter-follower differential amplifier pair. This differential amplifier pair includes two n-type FETs T6, T7. The gates of the transistors T6, T7 receive the input signals 106p, 106n, the drains are commonly connected to the voltage supply Vdd, and the sources are connected to ground through current sources 15, 16. In one embodiment, according to the voltage swing of the input signals 106p, 106n, the transistors T6, T7 generate outputs 110p, 110n at their respective sources, which are received at nodes 214, 216. The common mode voltage of the signals 110p, 110n may be less than Vdd, and not in the desired output voltage domain $V_{out}$. In one embodiment, the gain of the differential amplifier pair is g1, where g1 is desirably equal to one. However, in practical implementations, achieving unity gain may not be possible due to parasitic components in the differential amplifier pair, and the actual gain may be less than one. Accordingly, in one embodiment, a gain enhancement block 218 is connected at nodes 220, 222. The gain enhancement block 218 may include n-type FETs T8, T9, and a current source I7.

In one embodiment, the low frequency processed signal 108p is combined with the high frequency processed signal 110p at a combiner 112p. Similarly, the low frequency processed signal 108n is combined with the high frequency processed signal 110n at a combiner 112n. The combiners 112p, 112n may be structurally similar or different. As shown in FIG. 2, both the combiners are the same and each includes a resistor and a capacitor. The combiner 112p includes a resistor R4 connected with a capacitor C1, and the combiner 112n includes a resistor R5 connected with a capacitor C2. In another embodiment, the combiners 112p, 112n include passive networks comprising a resistor, a capacitor, and an inductor, or a capacitor and an inductor.

For the signal 108p coming in at the resistor R4, the combiner 112p may act as a first-order low pass RC filter, and for the signal 110p at the node 212 arriving at the capacitor C1, the combiner 112p may serve as a first-order high pass CR filter. The cut-off frequency of both the low pass and the high pass filters is the same, and is calculated as the inverse of the product of the resistance of (R4+R3) and the capacitance of C1. Accordingly, the combination of the low-pass signal 108p and the high-pass signal 110p, in the frequency response sense, may be seamless.

The signal 110p entering the CR high-pass filter is DC blocked due to the capacitor C1, while the rest of the frequencies are passed with different attenuations. Accordingly, the DC component of the signal 110p may not be related to the desired output voltage domain $V_{out}$, and the signal 110p may determine the overall bandwidth of a translator 100. As discussed above, the signal 108p is in the output voltage domain $V_{out}$, and hence, upon combination with the high-pass signal 110p, the combiner 112p generates an output signal 114p which is in the voltage domain $V_{out}$, and has the frequency range equal to the bandwidth of the translator 100.

Similar to the operation of the combiner 112p, the combiner 112n receives the low frequency processed signal 108n and act as a first-order low-pass filter for that signal, and receives the high frequency processed signal 110n at the node 216 and acts as a first-order high-pass filter for the signal 110n. The cut-off frequency of each of these filters is calculated as the inverse of the product of the resistance of (R5+R2) and the capacitance of C2, and this cut-off frequency may be different than the cut-off frequency of the filter of the combiner 112p. The combiner 112n combines the signals 108n and the signal 110 to generate an output signal 114n, and the common mode voltage of the signal 114n is, as desired, in the output voltage domain $V_{out}$.

Figure 3:
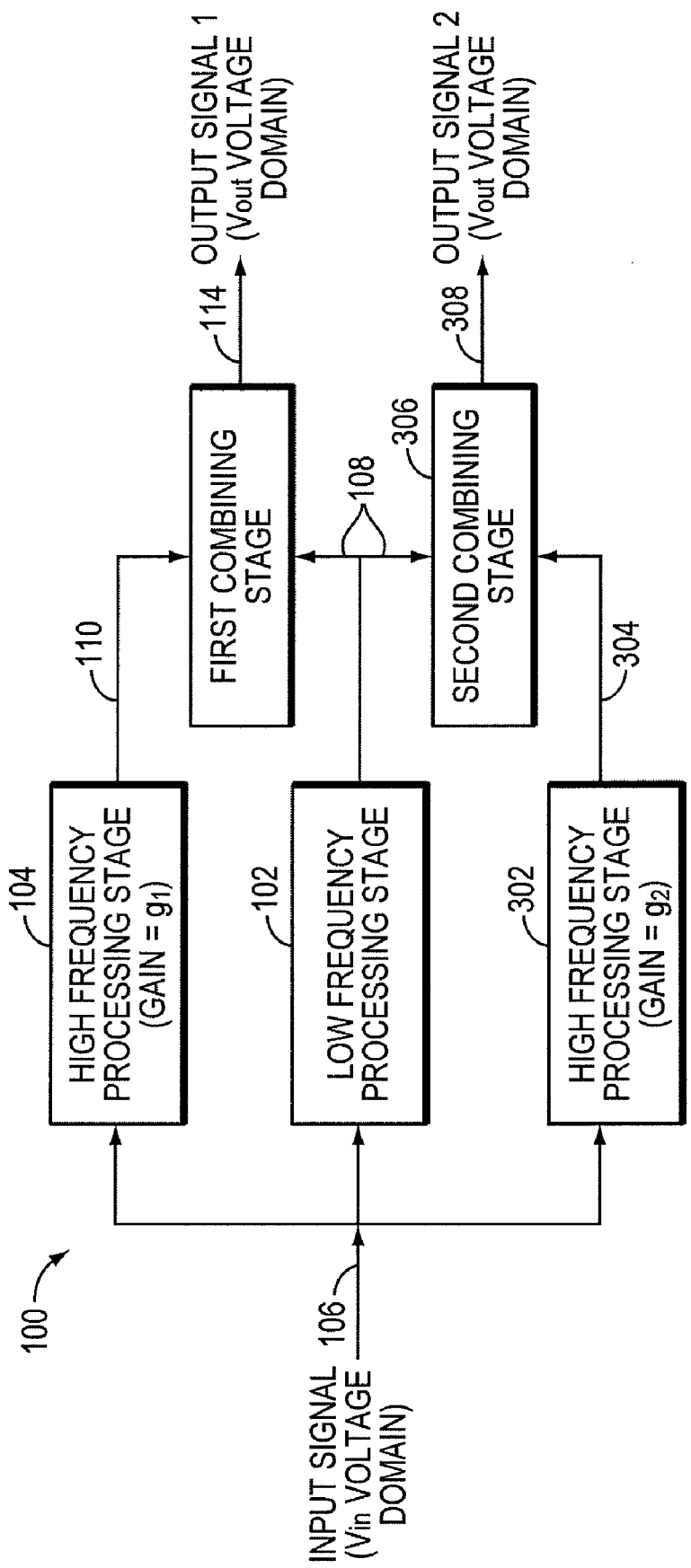
FIG. 3 depicts a block diagram a voltage translator according to another illustrative embodiment of the invention.

FIG. 3 shows a block diagram of a voltage translator 100 according to another illustrative embodiment of the invention. The illustrated translator translates the signal voltage from an input voltage domain, $V_{in}$, to an output voltage domain, $V_{out}$. The translator 100 includes a low frequency processing stage 102, a high frequency processing stage 104 providing an overall gain g1, and a high frequency processing stage 302 with an overall gain g2. In one embodiment, there is only one low frequency processing stage 102 required to work in parallel with one or more high frequency processing stages, e.g., stages 104, 302. In another embodiment, the high frequency processing stages 110, 304 are implemented differently to provide different gains. Such a translator implementation with multiple gains may be required as part of a programmable gain amplifier application for various communications and signal processing systems.

In this embodiment, all the stages receive the same input signal 106, which may be a single-ended signal or a differential signal. The low frequency processing stage 102 may be configured to process the input signal 106 and generate a signal 108 in a low frequency range. In one embodiment, the reference voltage (for the single-ended case) or the common mode voltage (for the differential case) of the low frequency processed signal 108 is in the desired output voltage domain, $V_{out}$. The high frequency processing stages 104, 302 may be configured to process the input signal 106 to generate signals 110, 304, respectively, in high frequency range. In one embodiment, the signals 110, 304 determine the overall bandwidth of the translator.

In one embodiment, the low frequency processed signal 108 and the high frequency processed signal 110 are combined at a combining stage 112, and the signal 108 is also combined with the high frequency processed signal 304 at a combining stage 306. The combining stages 112, 306 may be structurally different to maintain the different gains from the high frequency processing stages 104, 302. The combining stages 112, 306 combine their respective input signals to generate output signals 114, 308. In one embodiment, the signals 114, 308, each have the reference voltage or the common mode voltage in the desired output voltage domain, $V_{out}$, and also have the frequency range which covers the complete bandwidth of the translator 100.

Figure 4:
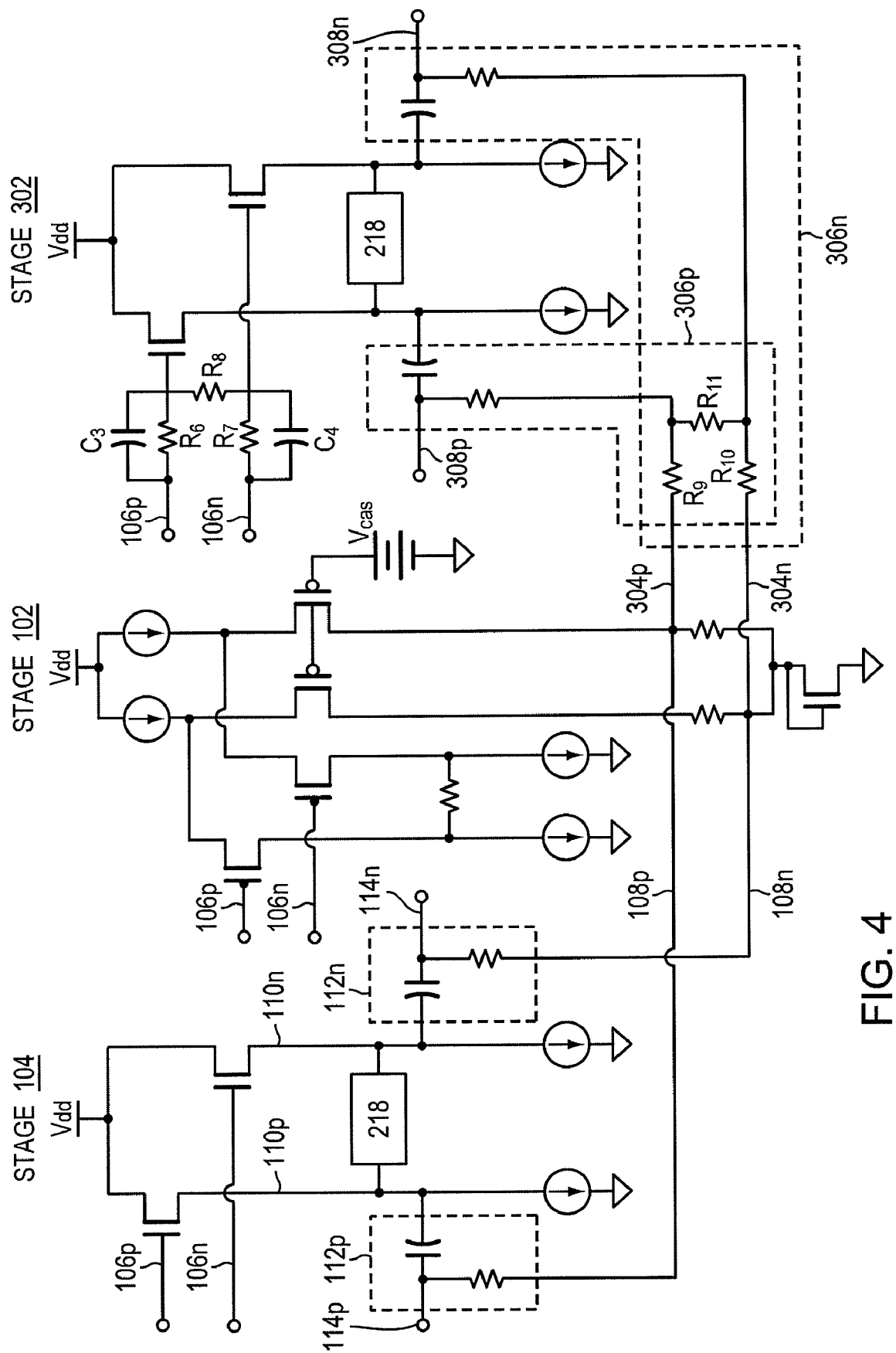
FIG. 4 depicts a CMOS implementation of the voltage translator depicted in FIG. 3.

FIG. 4 shows the detailed CMOS implementation of an embodiment of the translator 100 shown in FIG. 3. This implementation is shown and will be discussed with respect to differential signals. In this implementation, the stages 102, 104 and the combiners 112p, 112n are structurally identical to those shown in FIG. 2.

In this implementation, the high frequency processing stage 104 provides unity gain, i.e., g1=1, and the high frequency processing stage 302 provides gain, g2=½. In one embodiment, the implementation of the stage 302 is based on the implementation of the stage 104, i.e., including a source follower differential amplifier pair and a gain enhancement block. However, to provide a gain of ½ at the output, the differential input signals 106p, 106n may not be directly coupled to the gates of the transistor pair, as shown for the stage 104. In one embodiment, the input signals 106p, 106n are fed to a voltage divider network including resistors R6, R7, R8. Capacitors C3, C4 may be connected in parallel to the resistors R6, R7, respectively, to pass the AC component and block the DC component of the input signals 106p, 106n which is processed through the divider network.

In one embodiment, the implementations of the combiners 306p, 306n are based on the implementations of the combiners 112p, 112n, i.e., each including a resistor and a capacitor, but further includes a voltage divider network comprising resistors R9, R10, R11 in accordance with the specific gain requirement of the stage 302. The divider network including R9, R10, R11 is connected with the low frequency processed signals 108p, 108n (which determine the voltage domain $V_{out}$ of the output signal). Output signals 308p, 308n from the combiners 306p, 306n may have the common mode voltage in the domain $V_{out}$ with gain equal to ½.

Figure 5:
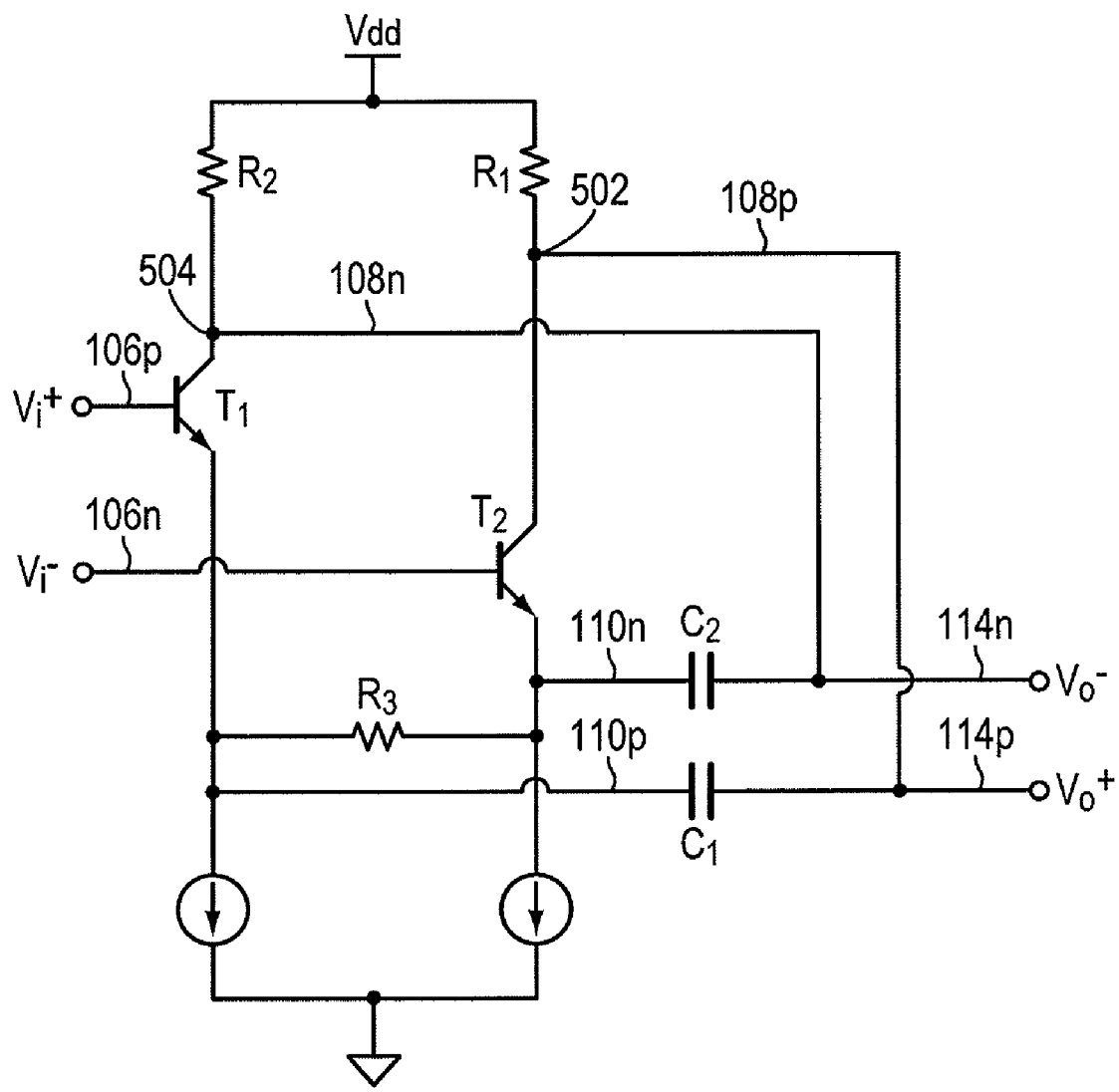
FIG. 5 depicts a merged BiCMOS implementation of the voltage translator depicted in FIG. 1.

FIG. 5 shows a merged BiCMOS implementation of an embodiment of the translator 100 shown in FIG. 1. In this implementation, bipolar junction transistors (BJTs) T1, T2 operate both as a transconductance amplifier for the low frequency processing stage 102, and as an emitter follower differential amplifier pair for the high frequency processing stage 104 of the translator 100. The bases of the transistors T1, T2 receive a differential signal including signals 106p, 106n with a common mode voltage in the input voltage domain $V_{in}$. The outputs of the transconductance amplifier 108p, 108n may be received at nodes 502, 504 across resistors R1, R2 connected to the collectors of the transistors T1, T2. The outputs of the emitter follower differential amplifier pair 110p, 110n may be received at the emitters of the transistors T1, T2 through capacitors C1, C2. In one embodiment, the signals 108p, 110p are combined at a combining stage comprising the resistor R1 and the capacitor C1 to generate an output signal 114p. In another embodiment, the signals 108n, 110n are combined at a combining stage comprising the resistor R2 and the capacitor C2 to generate an output signal 114n. The common mode voltage of the output signals 114p, 114n may be in the output voltage domain $V_{out}$.

In various embodiments, the translator 100 is powered between power supplies, Vdd and Vss, each of which may be a positive or a negative power supply.

Figure 6A:
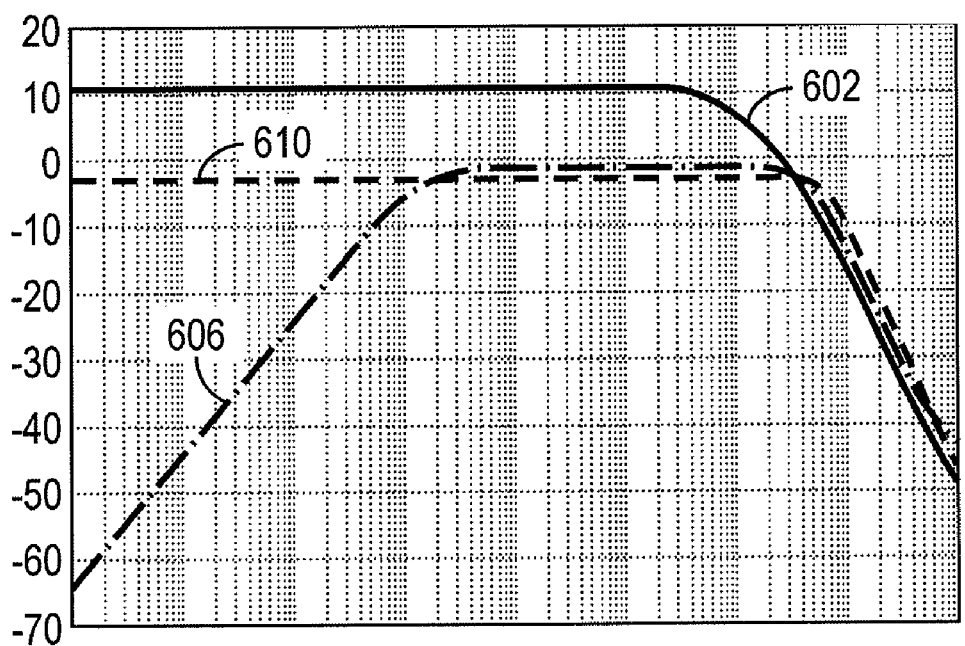
FIG. 6a depicts the magnitude of a frequency response of the BiCMOS implementation depicted in FIG. 5.
Figure 6B:
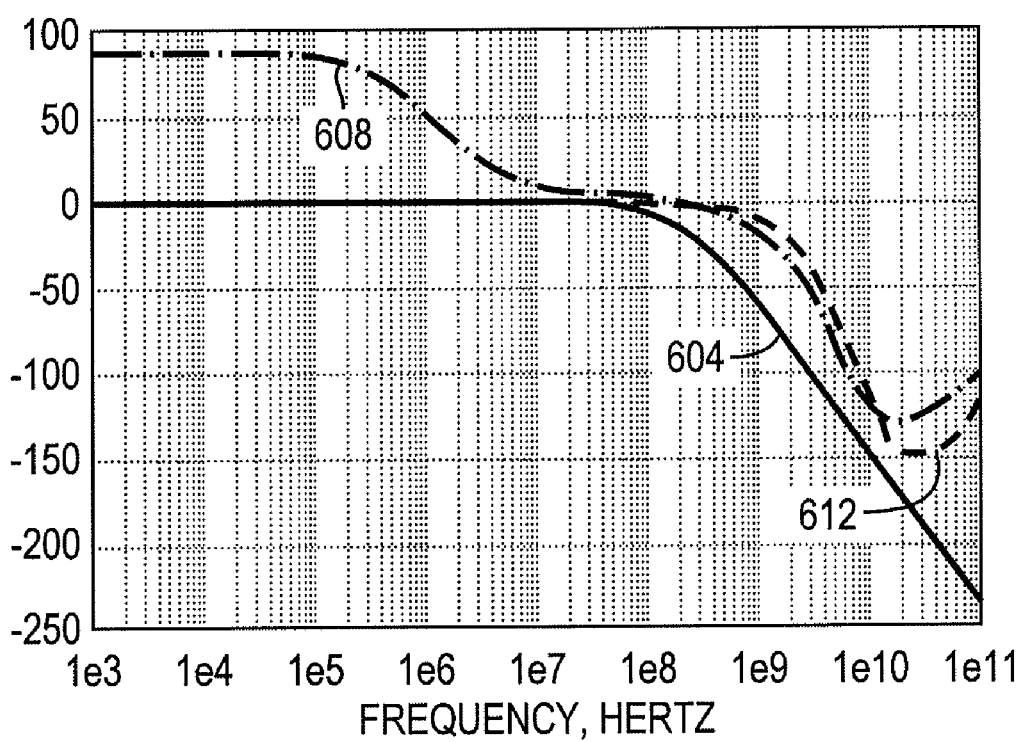
FIG. 6b depicts the phase of a frequency response of the BiCMOS implementation depicted in FIG. 5.

FIG. 6a, 6b plot the magnitude and phase, respectively, of a frequency response of the BiCMOS implementation of FIG. 5. Plots 602, 604 show the magnitude and phase frequency responses of the output of the low frequency processing stage 102 (i.e., the transconductance amplifier), plots 606, 608 show the magnitude and phase frequency responses of the output of the high frequency processing stage 104 (i.e., the emitter follower differential amplifier), and plots 610, 612 show the magnitude and phase frequency responses of the combined output.

It will therefore be seen that the foregoing represents a highly advantageous approach to translate signal voltage between different voltage domains in high-speed ICs. The terms and expressions employed herein are used as terms of description and not of limitation and there is no intention, in the use of such terms and expressions, of excluding any equivalents of the features shown and described or portions thereof, but it is recognized that various modifications are possible within the scope of the invention claims.

What is claimed is:

1. A voltage level translator for translating an input signal in an input voltage domain to an output signal in an output voltage domain, the translator comprising:
 a low frequency stage for receiving and processing the input signal to generate a first processed signal in a low frequency range, wherein the first processed signal is in the output voltage domain;
 a high frequency stage for receiving and processing the input signal to generate a second processed signal in a high frequency range, wherein the second processed signal determines a bandwidth of the translator; and
 a combining stage for combining the first and second processed signals to generate the output signal.

2. The voltage level translator of claim 1, wherein at least one of the input signal and the output signal is a single-ended signal or a differential signal.

3. The voltage level translator of claim 1, wherein the translator is implemented using CMOS or BiCMOS technology.

4. The voltage level translator of claim 1, wherein the low frequency stage comprises a DC-coupled amplifier.

5. The voltage translator of claim 4, wherein the DC-coupled amplifier comprises a transconductance amplifier for converting the input voltage signal into a current signal.

6. The voltage translator of claim 5, wherein the DC-coupled amplifier further comprises a conversion stage for receiving and converting the current signal into the first processed signal.

7. The voltage translator of claim 6, wherein the DC-coupled amplifier further comprises a cascode stage operatively connected between the transconductance amplifier and the conversion stage for transferring the current signal therebetween.

8. The voltage level translator of claim 1, wherein the high frequency stage comprises an AC-coupled amplifier.

9. The voltage level translator of claim 8, wherein the AC-coupled amplifier comprises a source follower or an emitter follower amplifier for amplifying the input signal to generate the second processed signal.

10. The voltage level translator of claim 8, wherein the AC-coupled amplifier further comprises a gain enhancement block.

11. The voltage level translator of claim 1, wherein the combining stage comprises an RC, an LC or an RLC filter.

12. The voltage level translator of claim 1, wherein the low frequency and high frequency stages are implemented using the same transistors.

13. A method of translating an input signal in an input voltage domain to an output signal in an output voltage domain, the method comprising:
- receiving and processing the input signal at a low frequency stage to generate a first processed signal in a low frequency range, wherein the first processed signal is in the output voltage domain;
- receiving and processing the input signal at a high frequency stage to generate a second processed signal in a high frequency range, wherein the second processed signal determines a bandwidth of the translator; and
- combining the first and second processed signals at a combining stage to generate the output signal.

14. The method of claim 13, wherein at least one of the input signal and the output signal is a single-ended signal or differential signal.

15. The method of claim 13, wherein the method is used in a voltage level translation circuit which is implemented using CMOS or BiCMOS technology.

16. The method of claim 13, wherein processing the input signal at the low frequency stage comprises converting the input voltage signal into a current signal.

17. The method of claim 16, wherein processing the input signal at the low frequency stage further comprises converting the current signal into the first processed signal.

18. The method of claim 13, wherein processing the input signal at the high frequency stage comprises amplifying the high frequency component of the input signal to generate the second processed signal.

19. The method of claim 13, wherein the combining stage comprises an RC, an LC or an RLC filter.

20. The method of claim 13, wherein the low frequency and high frequency stages are implemented using the same transistors.

* * * * *

UNITED STATES PATENT AND TRADEMARK OFFICE
CERTIFICATE OF CORRECTION

PATENT NO. : 8,106,700 B2  Page 1 of 1
APPLICATION NO. : 12/503372
DATED : January 31, 2012
INVENTOR(S) : Tam et al.

It is certified that error appears in the above-identified patent and that said Letters Patent is hereby corrected as shown below:

In Claim 5, column 8, line 42, after the first "voltage" please insert -- level --

In Claim 6, column 8, line 45, after "voltage" please insert -- level --

In Claim 7, column 8, line 49, after "voltage" please insert -- level --

Signed and Sealed this
Twelfth Day of June, 2012

David J. Kappos
*Director of the United States Patent and Trademark Office*